United States Patent [19]

Ehara et al.

[11] 4,448,800
[45] May 15, 1984

[54] METHOD FOR THE MANUFACTURE OF SEMICONDUCTOR DEVICE USING REFRACTORY METAL IN A LIFT-OFF STEP

[75] Inventors: Kohei Ehara, Kodaira; Susumu Muramoto, Hachioji; Takashi Morimoto, Tokorozawa; Seitaro Matsuo, Hachioji; Manabu Itsumi, Hoya, all of Japan

[73] Assignee: Nippon Telegraph and Telephone Public Corporation, Japan

[21] Appl. No.: 403,531

[22] Filed: Jul. 30, 1982

[30] Foreign Application Priority Data

Aug. 10, 1981 [JP] Japan .................................. 56-124168
Aug. 14, 1981 [JP] Japan .................................. 56-126643

[51] Int. Cl.³ .......................................... H01L 21/302
[52] U.S. Cl. ...................................... 427/39; 156/628; 156/647; 156/657; 156/662; 427/88; 427/93; 427/94; 427/259; 430/314

[58] Field of Search ...................... 427/89, 259, 39, 93, 427/94; 156/628, 647, 657, 662; 430/314

[56] References Cited

U.S. PATENT DOCUMENTS 3,873,361  3/1975  Franco .................................. 427/259
4,353,935 10/1982  Symersky ............................. 427/259

Primary Examiner—John D. Smith
Attorney, Agent, or Firm—McGlew and Tuttle

[57] ABSTRACT

A semiconductor manufacturing method which uses a refractory metal as a lift-off material and employs, in combination, a dry etching process suitable for forming a miniature pattern without undercutting and a film deposition method for depositing the lift-off material with directionality in a direction perpendicular to the substrate surface. A semiconductor device is fabricated by a lift-off method which is free from the fear of contamination, permits easy lift off of the lift-off material, even if large in area, and hence suitable for the formation of a high-density pattern.

7 Claims, 38 Drawing Figures

FIG. IA PRIOR ART
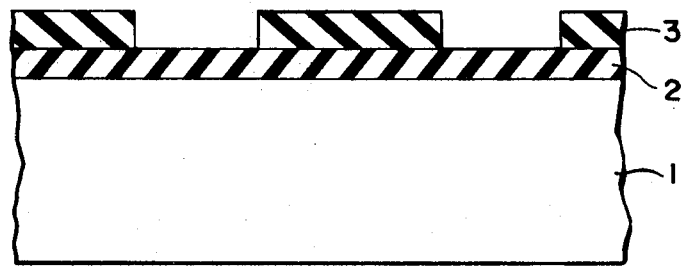
FIG. IB PRIOR ART
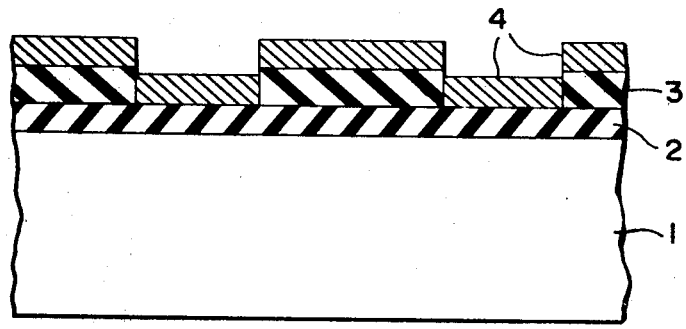
FIG. IC PRIOR ART
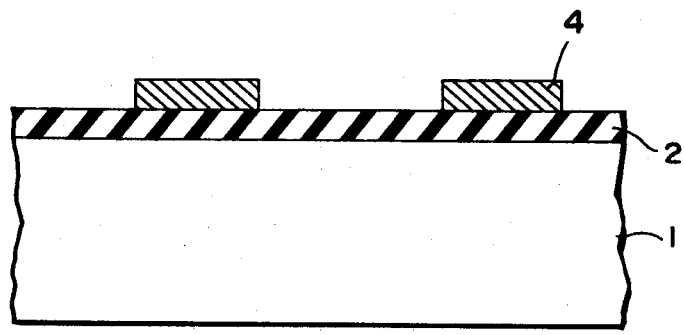

METHOD FOR THE MANUFACTURE OF SEMICONDUCTOR DEVICE USING REFRACTORY METAL IN A LIFT-OFF STEP

BACKGROUND OF THE INVENTION

1. Field of the Invention

The present invention relates to a method for the manufacture of a high-density, high-speed semiconductor device through using a refractory metal in a lift-off step.

2. Description of the Prior Art

With the recent progress of semiconductor integrated circuit technology toward large-capacity, high-density LSIs, miniaturization, surface planarization and multi-level metallization of respective structures forming the LSI, such as a field isolation structure, a gate electrode structure and an interconnection structure, are increasing in importance. One method that is effective for miniaturization, planarization and multilevel metallization is a lift-off process. In the prior art, a polymer such as resist and polyimide resin, aluminum and zinc oxide are employed in the lift-off process.

A conventional lift-off process using the resist is carried out in the following manner. In FIG. 1A, reference numeral 1 indicates a silicon substrate, and 2 designates a thermal oxide film or CVD $SiO_2$ film formed on the silicon substrate 1. A pattern 3 reverse from a wiring pattern is formed on the film 2 using photoresist. An aluminum film 4 is deposited by evaporation to cover the surfaces of the film 2 and the photoresist pattern 3 as shown in FIG. 1B. Then, the resist pattern 3 is dissolved by ultrasonic washing in acetone to lift off the overlying aluminum film 4, thus forming a wiring pattern as shown in FIG. 1C. This method is free from side etching, and hence is advantageous in that a miniature pattern can be formed. The basic concept of the lift-off process is as shown in FIGS. 1A to 1C. Various methods have been proposed for facilitating the lift-off step.

A description will now be given, with reference to FIGS. 2A to 2D, of an example of forming a miniature and planar wiring layer by utilizing the conventional lift-off method. In FIG. 2A, reference numeral 1 indicates a silicon substrate; 2 disignates an $SiO_2$ film; 13 identifies an aluminum film; and 14 denotes a resist pattern. The aluminum film 13 is selectively etched away using the resist pattern 14 as a mask to obtain a structure shown in FIG. 2B, on which an $SiO_2$ or $Si_3N_4$ film is deposited by sputtering to obtain a structure shown in FIG. 2C. Reference numeral 15 represents the deposited $SiO_2$ or $Si_3N_4$ film. The resist pattern 14 is dissolved by ultrasonic washing in acetone to lift off the overlying film 15, obtaining a planar structure depicted in FIG. 2D.

Another example using the prior art lift-off process will now be described with reference to FIGS. 3A to 3F. In FIG. 3A, reference numeral 1 indicates a silicon substrate; 2 designates a thermal oxide film; 33 identifies a polysilicon layer; and 34 denotes a resist pattern. The polysilicon film 33 is selectively etched away by a reactive ion etching method using the resist pattern 34 as a mask without causing side etching, thereby to obtain a structure shown in FIG. 3B. An insulating film, such as an $SiO_2$ or $Si_3N_4$ film, is formed on the surface of the structure by means of a thin film deposition method which is capable of depositing the film with a directionality in a direction perpendicular to the substrate surface, such as, for instance the ion beam sputter method, by which is obtained a structure shown in FIG. 3C. In FIG. 3C, reference numeral 35 represents an $SiO_2$ film deposited on the resist pattern 34 or the thermal oxide film 2; and 38 signifies $SiO_2$ films deposited on the side wall 37 of the resist pattern 34 and the side wall 36 of the polysilicon film 33. The directionality of the film deposition is excellent because the ions have directionality, but the $SiO_2$ film 38 is deposited on the side walls to a thickness of a fraction of the thickness of the $SiO_2$ film deposited on the flat surface portion. Accordingly, in the case where the $SiO_2$ film 38 is not removed by etching, if it is thin and has a pinhole, the lift-off of the resist pattern 34 can be performed but the yield rate of the lift-off operation is low and a burr remains unleft after the lift-off. In this case, however, bonding of the $SiO_2$ film 38 deposited on the side wall is loose and its etching rate is higher than that of the $SiO_2$ film 35 deposited on the flat surface portion, so that the structure after etching away the $SiO_2$ film 38 is such as shown in FIG. 3D. The resist pattern 34 is dissolved by ultrasonic washing with a solvent to lift off the overlying $SiO_2$ film, providing a structure depicted in FIG. 3E. In this case, the top surfaces of the $SiO_2$ film 35 and the polysilicon film 33 are flush with each other but V-shaped grooves are formed in the side wall 36 of the polysilicon film 33, resulting in a non-planar surface structure. If the quantity of etching is reduced so as to prevent the formation of the V-shaped grooves, then the $SiO_2$ film 38 remains as a burr 39 or a film 40 completely covering the side wall of the resist 34 after the lift-off step as shown in FIG. 3F.

The above-described examples of the conventional lift-off technique employ such polymer as resist and PIQ, and they are subjected to a subsequent electrode wiring process in which heat treatment temperature is under 500° C. at the highest. The resist and the PIQ are heat-resistant at temperatures below 200° C. and 450° C., respectively, but their compositions undergo a variation such as thermal decomposition or the like at higher temperatures. Accordingly, in the case where the resist or PIQ is not completely lifted off but partly remains unremoved in the abovesaid lift-off process, if the remainder does not act as a source of contamination in the subsequent manufacturing steps, the abovementioned material could be used. However, in the event that the subsequent manufacturing process involves high-temperature treatment for thermal oxidation, impurity thermal diffusion and so forth, contamination by the remainder of the lift-off material poses a serious problem.

Materials that have been studied as lift-off materials of higher heat resistance are aluminum and zinc oxide (ZnO), for instance. Aluminum has a melting point of 600° C. but, at temperatures above 300° or 400° C., grain boundaries are grown in an aluminum film to increase irregularities of the film surface, making it impossible to form a miniature pattern. Accordingly, the temperature at which aluminum can be used as the lift-off material is 500° C. at the highest. Furthermore, if aluminum remains unremoved after the lift-off process, it acts as an impurity source for silicon; therefore, aluminum cannot be used in the manufacturing process that subsequently involves a step of high temperature heat treatment at 800° to 1200° C. Since zinc oxide is resistant to heat above 500° C. and soluble in a 1% phosphoric acid solution, it is used for lifting off a niobium compound which is a superconducting material. At 850° C. and above, however, the zinc oxide reacts with SiO$_2$ to form Zn$_2$SiO$_4$, so that if the zinc oxide partly remains unremoved after the lift-off process, the subsequent high temperature heat treatment cannot be performed with an SiO$_2$ film formed to underlie or overlie it.

As described above, according to the conventional liftoff method, the lift-off materials are all used in a low temperature process under 500° C. at the highest. Accordingly, in the case where the lift-off material remains unremoved in the conventional lift-off process, contamination or reaction occurs in the subsequent high temperature heat treatment in the range of 800° to 1200° C., resulting in lowered yield of device fabriacation. For this reason, the prior art lift-off technique cannot be employed in the manufacturing process which involves high temperature heat treatment after the lift-off process.

SUMMARY OF THE INVENTION

It is therefore an object of the present invention to provide a semiconductor device manufacturing method which uses a refractory metal, such as molybdenum, tungsten, tantalum, titanium, zirconium, niobium or the like, as a lift-off material and permits high temperature heat treatment even if a remainder of the lift-off material is formed, which enables fabrication of semiconductor devices with good yield even if the lift-off process is carried out prior to high temperature heat treatment steps, such, for example, as an oxidation step, an impurity diffusion step, a high temperature annealing step, or the like.

Another object of the present invention is to provide a semiconductor device manufacturing method which employs the abovesaid refractory metal as a lift-off material and carries out high temperature heat treatment prior to the lift-off process, thereby to obtain a planar surface structure free from a burr or V-shaped groove.

Yet another object of the present invention is to provide a semiconductor device manufacturing method which permits the formation of the miniature pattern and planar surface structure and achieves effective masking against ion implantation and which is suitable for fabrication of high-density and high-speed LSIs.

BRIEF DESCRIPTION OF THE DRAWINGS

FIGS. 1A to 1C are cross sectional views showing an example of a conventional lift-off method using resist;

DESCRIPTION OF THE PREFERRED EMBODIMENTS

Figure 2A:
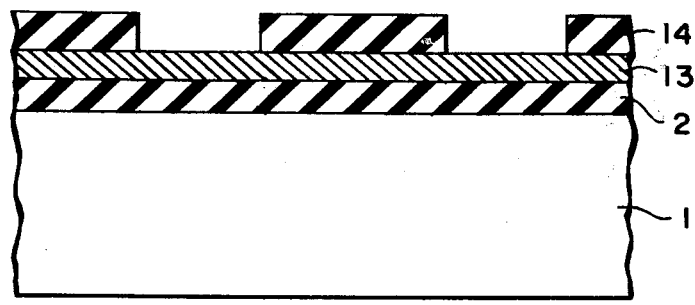
FIGS. 2A to 2D are cross sectional views showing another example of the conventional lift-off method for forming a miniature and planar wiring layer.
Figure 2B:
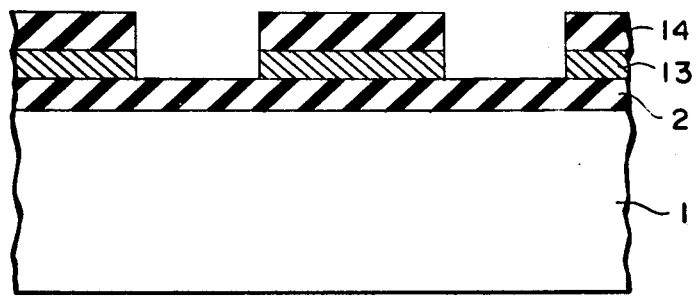
Figure 2C:
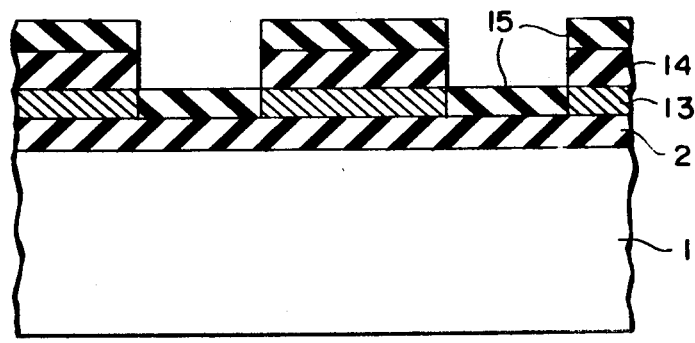
Figure 2D:
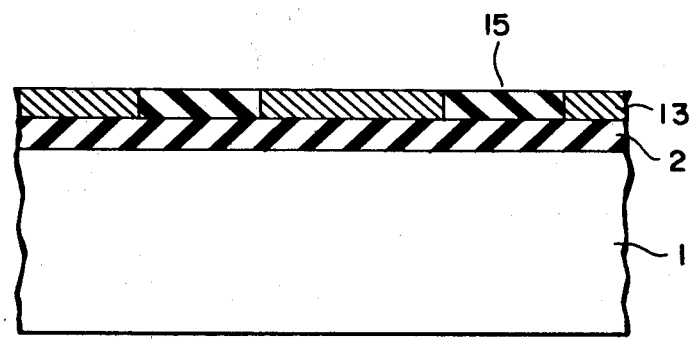
Figure 3A:
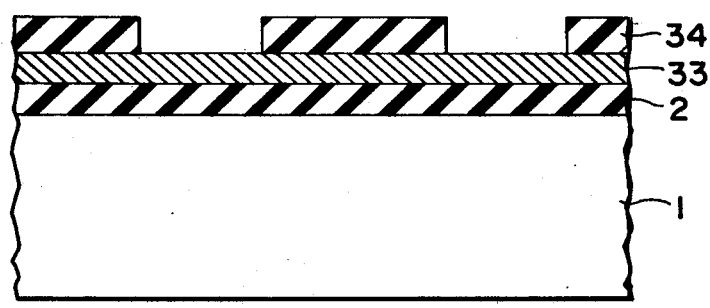
FIGS. 3A to 3F are cross sectional views showing another example of the conventional lift-off method using resist.
Figure 3B:
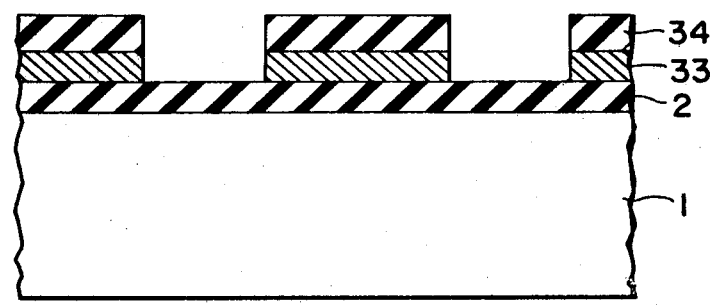
Figure 3C:
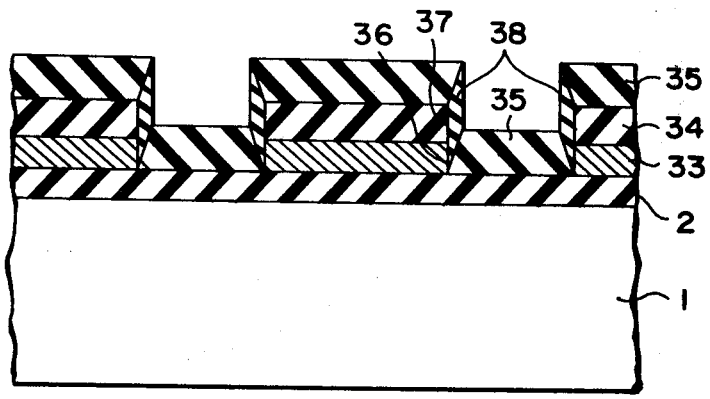
Figure 3D:
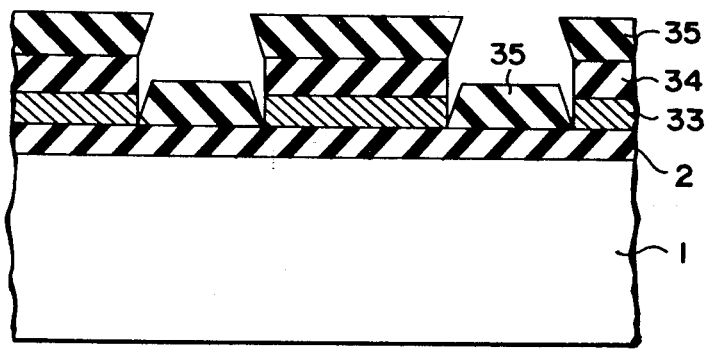
Figure 3E:
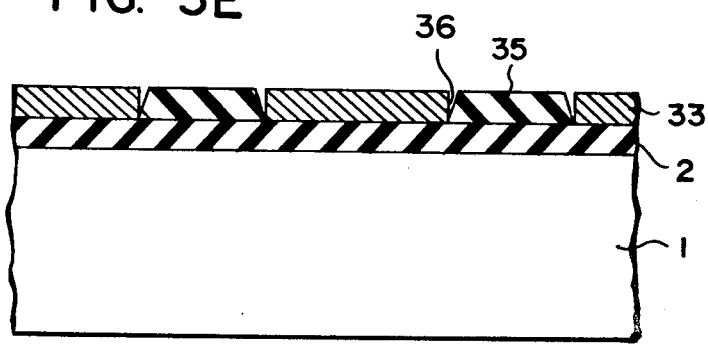
Figure 3F:
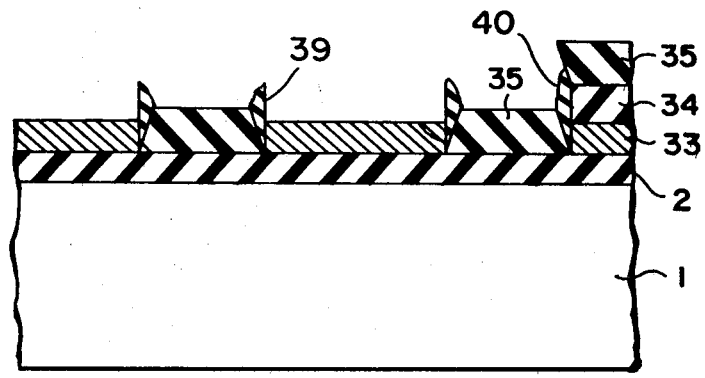
Figure 4A:
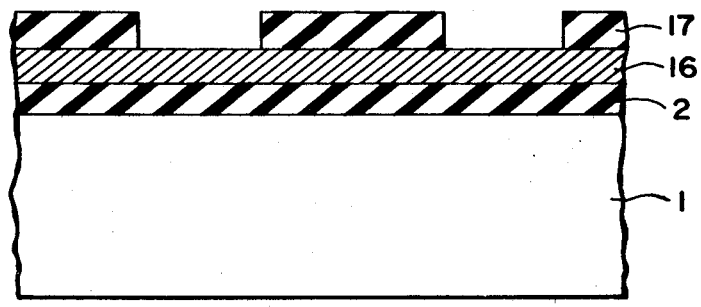
FIGS. 4A to 4E are cross sectional views illustrating a first embodiment of the lift-off method of the present invention.
Figure 4B:
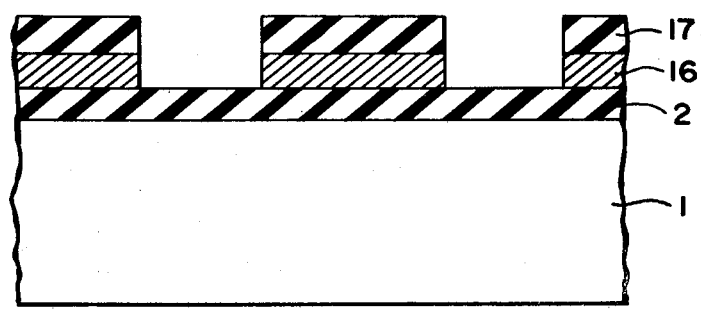
Figure 4C:
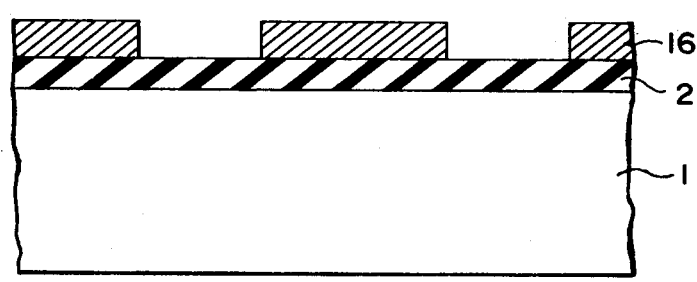

FIGS. 4A to 4E illustrate a first embodiment of the lift-off method of the present invention. In FIGS. 4A to 4E, reference numeral 1 indicates a silicon substrate; 2 designates a thermally oxidized film or CVD SiO$_2$ film (5000 Å thick); 16 identifies a molybdenum film (5000 Å thick necessary. Of course, the molybdenum film 16 may be deposited by any known methods, such as evaporation, sputter, CDV method and so forth. FIG. 4B shows a structure obtained by selectively removing the molybdenum film 16 through dry etching using the resist pattern 17 as a mask. It is a matter of course that the wet etching method can be used instead of the dry etching method. In the case of the wet etching, however, side etching occurs. FIG. 4C shows a structure obtained by removing the resist pattern 17 from the molybdenum film 16. On the top surface of this structure, for instance, a silicon film 18 is formed as a deposited film by the sputter method, an ECR plasma deposition method or the like. The ECR plasma deposition method is one that employs an ECR (Electron Cyclotron Resonance) plasma deposition apparatus described in detail in "Plasma Deposition Apparatus" (Japanese Patent Application No. 57877/80) and "Low Temperature Plasma Deposition Apparatus" (Japanese Patent Application No. 18986/81) filed by the same assignee as the subject application. With the ECR plasma deposition method, high density, high quality film can be deposited on a semiconductor substrate with good adhesion while holding the substrate at low temperatures. FIG. 5 schematically illustrates the outline of the ECR plasma deposition apparatus. In FIG. 5, reference numeral 521 indicates a plasma generating chamber; 522 designates a specimen chamber; and 523 identifies a microwave introduction window. As a microwave source, in this case, a magnetron of a 2.45 GHz frequency is used, and its microwave power is introduced through the microwave introduction window 523 into the plasma generating chamber 521 from a rectangular waveguide 524. The plasma generating chamber 521 is cooled by cooling water which flows from a feed port 525 to an exhaust port 525'. Two gas introduction systems are used; a first gas introduction system 526 is to introduce gas into the plasma generating chamber 521, and a second gas introduction system 527 is to introduce gas into the specimen chamber 522. An evacuation system 532 comprises, for instance, an oil diffusion pump and an oil rotary pump, which are not illustrated.

The plasma generating chamber 521 has, on the opposite side from the microwave introduction window 523, a plasma extraction window 529 for extracting a plasma stream 528 from the plasma generating chamber 521. The shape and size of the plasma generating chamber 521 are determined so that it may act as a microwave cavity resonator. On the outside of the plasma generating chamber 521 are provided coils 533, and the intensity of the magnetic field yielded by the coils 533 is so selected as to satisfy the condition for electron cyclotron resonance by microwave (a magnetic flux density of 875 gausses) in the plasma generating chamber 521.

Further, such an arrangement is made that the magnetic field generated by the coils 533 may extend to the specimen chamber 522, by which there is set up in the chamber 522 a divergent magnetic field the intensity of which diminishes at a proper gradient toward a specimen table 530 that is in an electrically floating state.

With the ECR plasma deposition apparatus, plasma is generated, through using microwave, in the plasma generating chamber 521 in a manner to develop electron resonance, and the plasma is led along the divergent magnetic field from the plasma generating chamber 521 to the specimen chamber 522, wherein it is applied to a specimen 531 on the specimen table 530 in the electrically floating state, thereby forming a desired film on the specimen 531. According to such a film deposition method employing the ECR plasma deposition apparatus, electrons in the plasma are continuously accelerated while continuing circular motion in the magnetic field and they become high-energy. By virtue of the interaction between the magnetic moments of the high energy electrons themselves and the divergent magnetic field, the electrons flow along the divergent magnetic field to reach the specimen 531 to charge it negatively, inducing an electrostatic field in the plasma stream between the plasma generating chamber 521 and the specimen table 530. The electrostatic magnetic field brings about a plasma acceleration state in which ions in the plasma stream are accelerated and the electrons are decelerated. The distribution of the electrostatic magnetic field is such that satisfies the neutralizing condition for feeding the electrons and ions at the same flow rate. This plasma acceleration is particularly remarkable under such an electron cyclotron resonance condition that electrons have large circular motion energy.

With the ECR plasma deposition process, the ions for the film deposition are obtained by directly generating plasma of a film material itself by using microwaves under the condition that causes electron cyclotron resonance; alternatively, the ions are obtained by generating plasma of an excitation gas (for example, argon) by using microwaves under an electron cyclotron resonance condition first and then ionizing the film material by the resulting high energy electrons. In either case, the ions thus yielded are accelerated by the abovementioned plasma acceleration toward the specimen table 530 and bombard the specimen 531 substantially perpendicularly thereto. Consequently, the film deposited on the specimen 531 has directionality. That is to say, the film thus deposited is of high density in the direction of incidence of the ions, and substantially no film is deposited on the side wall of a surface step. The film, even if deposited on the side wall, is extremely low in density compared to the planar surface portion, and is hardly resistant to etching.

Furthermore, in the ECR plasma deposition process, since the film deposition reaction is promoted by bombarding the specimen 531 with the ions which are subjected to the plasma acceleration, the film deposition can be achieved at room temperature without the need for applying thermal energy to the specimen from the outside.

Now, a description will be given of how the film is deposited on the specimen. In the case of depositing an $Si_3N_4$ film, $N_2$ and $SiH_4$ gases are introduced into the first and second gas introduction systems, respectively, and the gas pressure in the specimen chamber is set to the order of $10^{-4}$ Torr. In the case of an $SiO_2$ film, an $O_2$ gas is used in place of the $N_2$ gas. In the case of a silicon film, and inert gas such as argon is employed instead of the $N_2$ (or $O_2$) gas. For the film deposition of other materials, the abovesaid method can be employed if the film rag materials can be supplied in the form of gas. For instance, an aluminum film can be obtained by introducing argon into the first gas introduction system and, for example, $Al(CH_3)$ into the second gas introduction system.

With such an ECR plasma deposition technique, even if the substrate is held at as low a temperature as below 100° C. as mentioned previously, a very high quality film can be deposited with good adhesion over a large area (a 20 cm diameter region in an embodiment of the present invention).

Figure 4D:
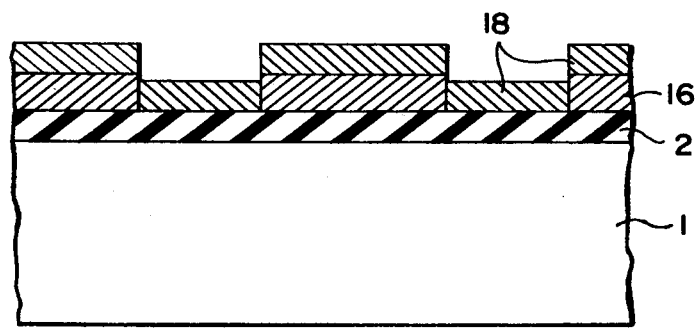
Figure 4E:
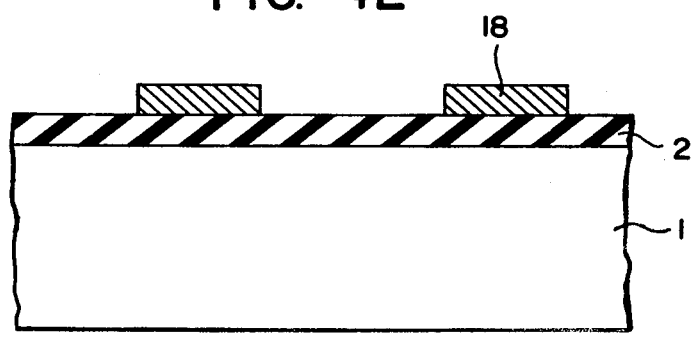
Figure 5:
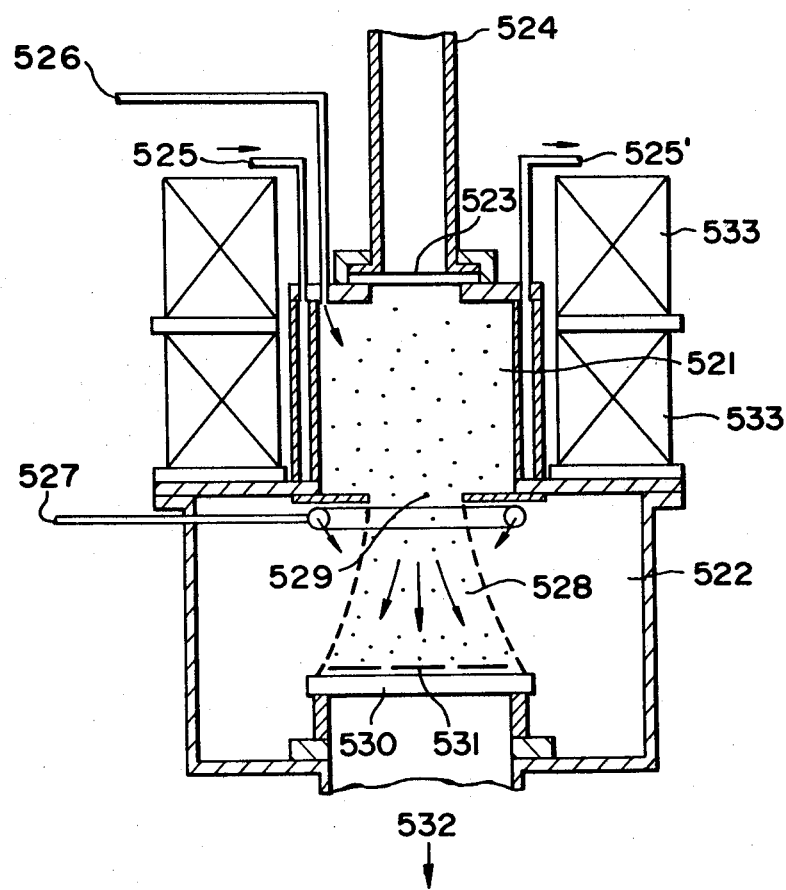
FIG. 5 is a schematic diagram explanatory of the outline of an ECR plasma deposition apparatus for use with the present invention.

FIG. 4D illustrates a structure with the silicon film 18 deposited by the ECR plasma deposition technique. The molybdenum film 16 is lifted off using an etchant which dissolves molybdenum, for example, an etchant composed of an $H_2SO_4/H_2O_2$ mixture solution. Since the molybdenum film 16 is subjected to side etching at a rate of about 70 $\mu$m/min in the $H_2SO_4/H_2O_2$ mixture solution, it can easily be lifted off even if it is large in area. FIG. 4E shows a structure obtained after the lift-off process. In the structure of FIG. 4D, when the molybdenum film 16 cannot be lifted off because of the deposition of the silicon film on the side wall of the molybdenum film 16, the silicon film is etched away to expose the side wall of the molybdenum film 16, permitting it to be lifted off. It is also possible, of course, to deposit an $SiO_2$ or $Si_3N_4$ film instead of depositing the abovesaid silicon film. In any case, when the film is deposited by the ECR plasma deposition technique, since the film deposited on a part of the side wall of the molybdenum film 16 is extremely thin and poor in density as mentioned previously, the underlying portion of the side wall of the molybdenum film 16 can easily be exposed by etching. Moreover, since the film deposited by the ECR plasma deposition technique is very excellent in directionality, the deposited film is formed homogeneously except on the side wall of the molybdenum film 16. Accordingly, the use of the ECR plasama deposition method is advantageous in that there is substantially no possibilities of a burr or the lift-off material remaining after the lift-off step. Furthermore, although in the above statement molybdenum is employed as the lift-off material, it is also possible to use such a refractory metal as tungsten, tantalum, titanium, ziroconium, niobium or the like. For instance, tungsten very quickly dissolves into a mixture of hydofluoric acid and concentrated nitric acid, and tantalum dissolves into a solution of NaOH and $H_2O_2$ therefore, their deposited film can be lifted off with practically no etching of polysilicon, $SiO_2$ or $Si_3N_4$. In the structure of FIG. 4E, even if the yield rate of the lift-off is not 100% and the lift-off material partly remains unremoved, since the refractory metals, such as molybdenum, tungsten, tantalum and so on, do not act as a source of contamination, high temperature heat treatment can be effected in the subsequent manufacturing process. For example, the refractory metal is readily oxidizable but oxides of the refractory metals, such as $WO_3$, $Ta_2O_5$, $ZrO_2$ and so forth, have a high melting point above 1400° C. Accordingly, an oxidizing step can be carried out in the subsequent manufacturing process. Of course, it is evident that the refractory metals do not pose any problems when subjected to heat treatment in an inert gas atmosphere.

Figure 6A:
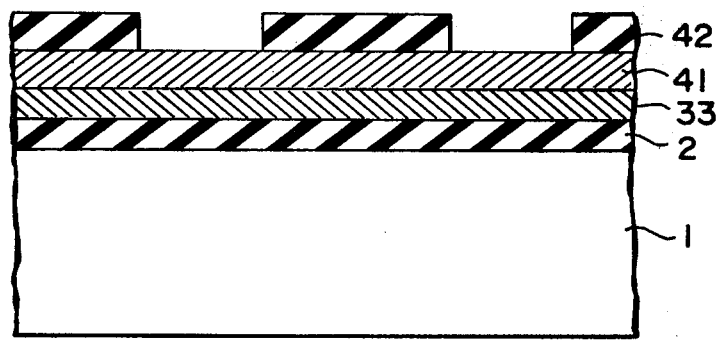
FIGS. 6A to 6F are cross sectional views illustrating a second embodiment of the present invention for surface planarization.
Figure 6B:
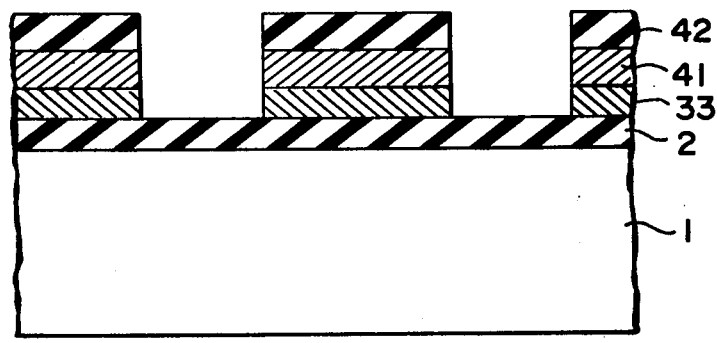
Figure 6C:
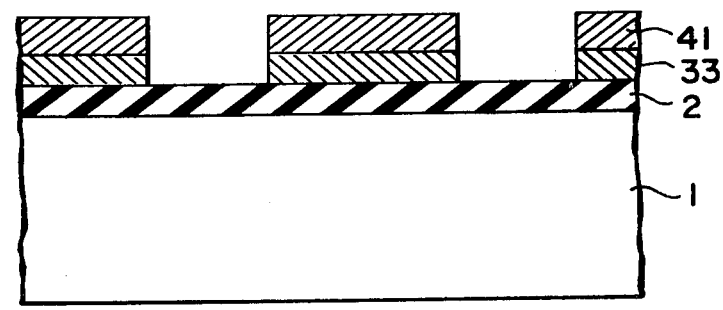
Figure 6D:
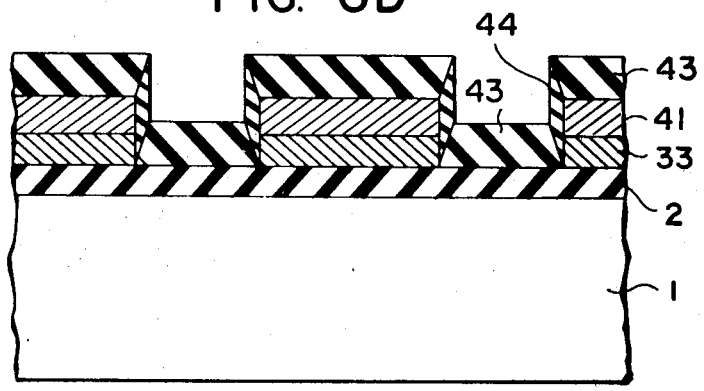
Figure 6E:
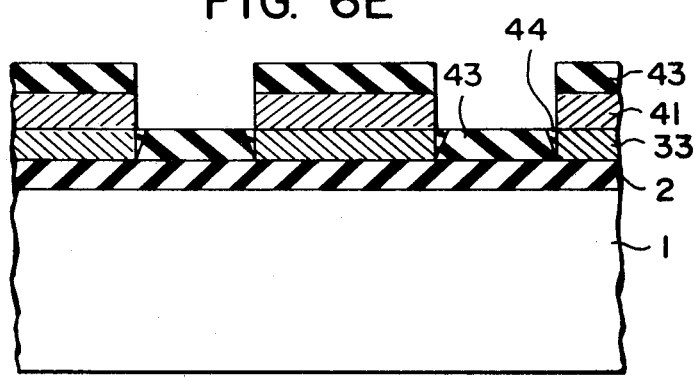
Figure 6F:
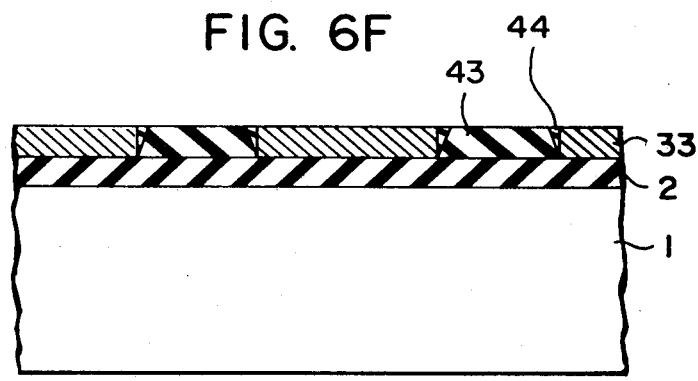
Figure 7:
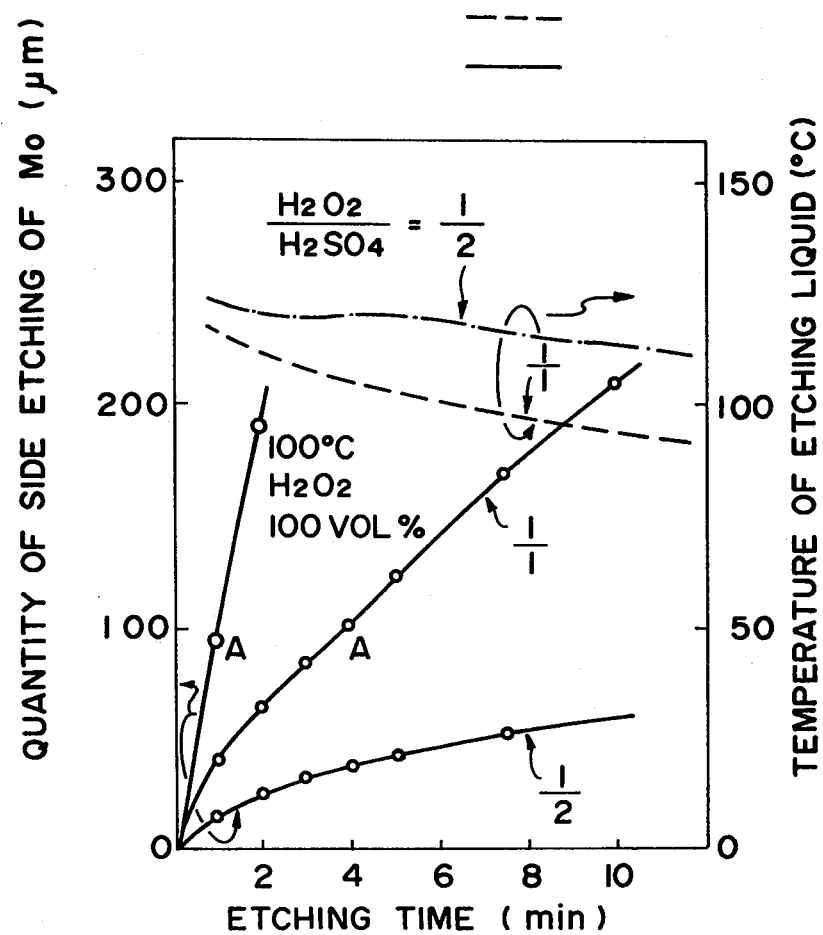
FIG. 7 is a graph showing the relation between the quantity of side etching of molybdenum and the etching time.

FIGS. 6A to 6F illustrate a second embodiment of the lift-off technique according to the present invention. In FIG. 6A, reference numeral 1 indicates a silicon substrate; 2 designates a thermal oxide film as a first material layer (5000 Å thick); 33 identifies a nondoped polysilicon film as a second material layer (4500 Å thick); 41 denotes a molybdenum film as a refractory metal layer (7000 Å thick); and 42 represents a resist pattern. In this case, the substrate assembly having the thermal oxide film 2 and the polysilicon film 33 formed in this order on the substrate 1 is used as the specimen. The molybdenum film 41 is selectively removed by parallel plate plasma etching using the resist pattern 42 as a mask in a $Cl_4/O_2$ mixture gas atmosphere. Further, the polysilicon film 33 is selectively removed by parallel plate etching using the resist pattern 42 and the molybdenum film 41 as a mask in a $CCl_4$ gas atmosphere. The abovesaid etching is performed by a reactive ion etching technique without causing side etching. FIG. 6B shows the structure after the etching. It is also possible, of course, to remove the resist pattern 42 prior to the etching of the polysilicon film 33 and use the molybdenum film 41 as a mask for etching the polysilicon film 33. FIG. 6C shows the structure after the etching of the polysilicon film 33 and the removal of the resist pattern 42. On the top surface of this structure an $SiO_2$ film is deposited by the sputtering method, the ECR plasma deposition method or the like to a thickness a little larger than the polysilicon film 33 as shown in FIG. 6D. The $SiO_2$ film is deposited on the molybdenum film 41 as indicated by 43 and, at the same time, it is deposited on the side walls of the molybdenum film 41 and the polysilicon film 33, too, as indicated by 44. If such a structure is subjected to isotropic etching as it is, V-shaped grooves are formed because the etching rate of the $SiO_2$ film 44 is higher than the etching rate of the $SiO_2$ film 43. To avoid this, prior to the isotropic etching, the substrate assembly is heat treated in an $N_2$ atmosphere at 900° C. for 30 minutes to change the quality of the $SiO_2$ film 44 to be substantially the same as the quality of the $SiO_2$ film 43, after which the substrate assembly is subjected to the isotropic etching, obtaining a structure shown in FIG. 6E. The $SiO_2$ film 44 on the side wall is rendered close-packed or high-density by virtue of the heat treatment, and hence is not excessively etched away in the subsequent etching step, ensuring that no V-shaped grooves are formed as shown in FIG. 6E. The high temperature treatment after the formation of the deposited film is effective in the foregoing first embodiment, too. After the isotropic etching the structure of FIG. 6E is subjected to the lift-off step using an $H_2SO_4/H_2O_2$ mixture solution. In this mixture solution the molybdenum film 41 is side-etched at a rate of about 70 μm/min, so that it can easily be lifted off even if it has a large area. For reference, there is shown in FIG. 7 the relationship between the quantity of side etching of the molybdenum film and the etching time. As a result of the lift-off step, a surface-planar structure is obtained which has neither a V-shaped groove nor burr as depicted in FIG. 6F.

Of course, it is also possible to form the film 33 of $SiO_2$ and the film 43 and 44 of silicon. Further, such refractory metals as tungsten, titanium, tantalum, zirconium, niobium, etc. can be used in place of molybdenum, and it is possible to employ these refractory metals containing oxygen or nitrogen. The refractory metal containing oxygen or nitrogen can be formed by sputtering or high temperature heat treatment in an $H_2/N_2$ atmosphere. In the structure of FIG. 6F, even if the yield rate of the lift-off is not 100% and the lift-off material partly remains unremoved, the refractory metal does not become a source of contamination, so that high temperature treatment can be effected in the subsequent manufacturing process as described previously in respect of the first embodiment. For instance, the refractory metals are readily oxdizable but their oxides, such as $WO_3$ and $Ta_2O_5$, generally have a high melting point above 1400° C. Accordingly, an oxidizing step can be carried out in the subsequent process. Of course, it is evident that the refractory metals do not pose any problems when subjected heat treatment in an inert gas atmosphere. Moreover, it is needless to say that the temperature for the abovesaid heat treatment is selected to be optimum in terms of the manufacturing process in the range of 700° to 1100° C. Besides, in the case where the thermal oxide film 2 is a gate oxide film in FIG. 6C, the refractory metal film 41 overlies the polysilicon film 33 as seen from FIG. 6C, so that when an impurity is introduced by ion implantation into the semiconductor substrate 1 through the gate oxide film 2, the combination of the refractory metal film 41 and the polysilicon film 33 heightens the masking effect for the ion implantation as compared with the polysilicon film 33 alone. The masking effect is further enhanced when the refractory metal contains nitrogen. Moreover, in the case where the refractory metal film 41 and the polysilicon film 33 are selectively removed by reactive ion etching using the resist pattern 42 as a mask in FIG. 6A, if the refractory metal film 41 is of pure metal, then it is difficult to select the ratio of the etching rate between the refractory metal film 41 and the polysilicon film 33, but if the refractory metal contains oxygen or nitrogen, the ratio of the etching rate between them becomes easy to select. The matters described above imply that the conditions for the manufacture can be selected more freely.

As described in the foregoing, according to the present invention, it is possible to form a polysilicon film which has a flat surface and a miniature pattern, sure to produce the masking effect for ion implantation and withstands high temperature heat treatment; accordingly, when employed in the formation of a polysilicon film for the gate of LSIs, the present invention is of great utility for the fabrication of high-density and high-speed LSIs.

Figure 8A:
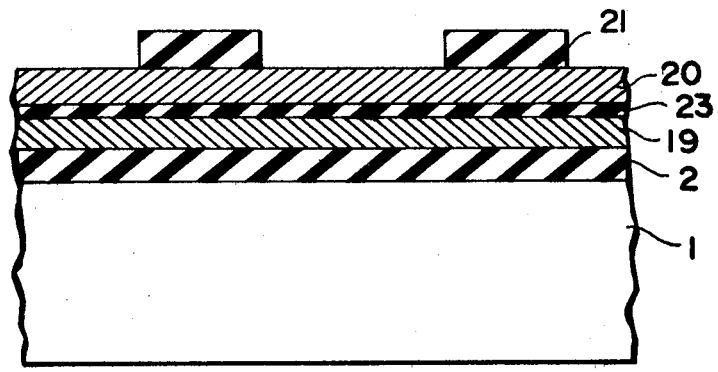
FIG. 8A to 8E are cross sectional views illustrating a third embodiment of the present invention for surface planarization.
Figure 8B:
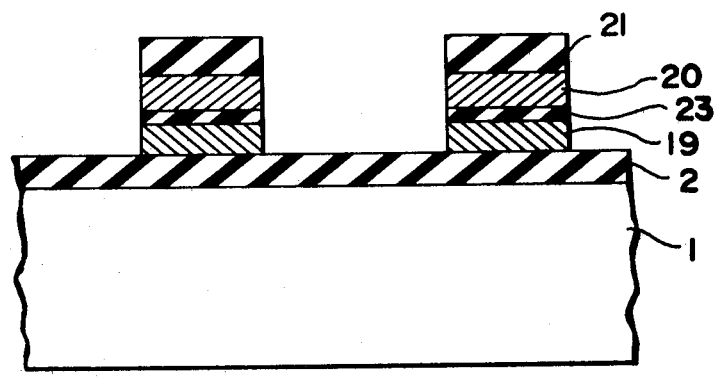
Figure 8C:
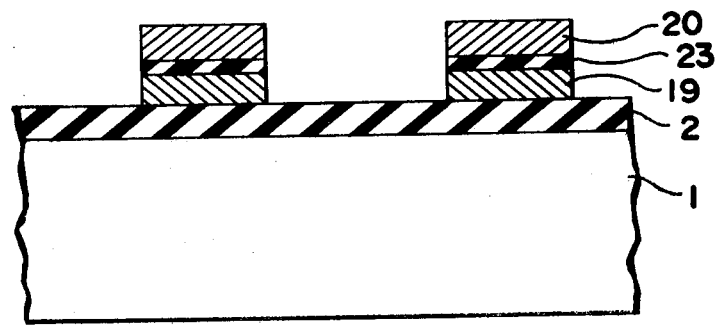
Figure 8D:
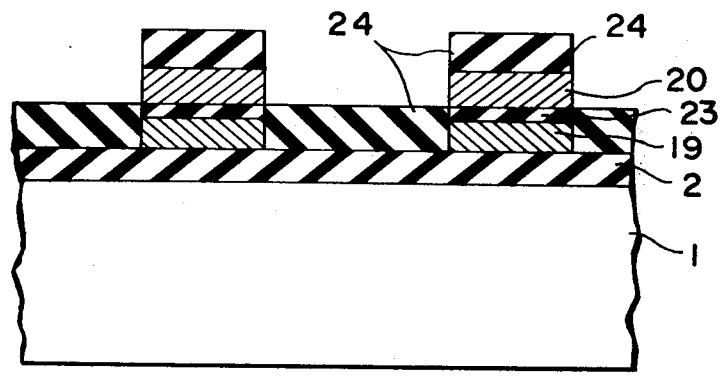
Figure 8E:
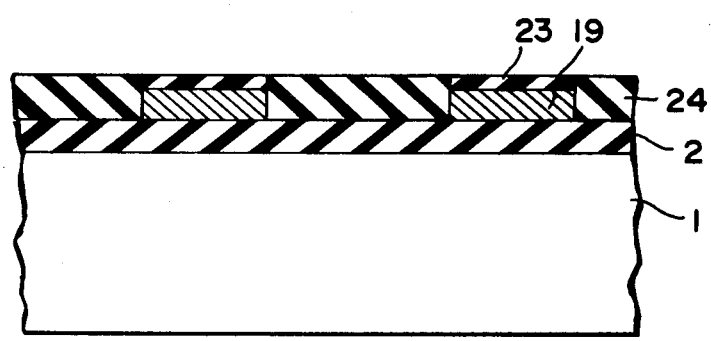

The refractory metals, such as molybdenum, tungsten, tantalum, etc., react with the underlying film in accordance with the condition of formation of the refractory metal film and the material of the underlying film. For example, in the case where tantalum is deposited directly on the polysilicon film the tantalum diffuses into the polysilicon film when the substrate temperature is in the range of room temperature to 600° C. during or after the deposition. Above 600° C. the silicon conversely diffuses into the tantalum film to form silicide at the interface between them. In this way, a reaction layer is formed at the interface between the tantalum film and the polysilicon film and, according to the condition of its formation, the reaction layer affects the surface structure of the specimen and etching conditions, and hence it may pose a problem in miniaturization. In such an instance, it is effective to form an $SiO_2$, $Si_3N_4$ or like film between the refractory metal film and the underlying film. In this case, it is sufficient that the film thickness is 200 to 300 Å, and the film may be formed by the CVD method and, in the case of polysilicon, it may be a formed by thermal oxidation. FIGS. 8A to 8E illustrate a third embodiment of the present invention as being applied to the above case. In FIG. 8A, reference numeral 23 indicates the abovesaid $SiO_2$ or $Si_3N_4$ film sandwiched between the polysilicon film and the molybdenum film. The subsequent manfuacturing steps following the formation of the film 23 to the lift-off step of obtaining the structure shown in FIG. 8E are carried out in the same manner as described previously.

In any of the foregoing embodiments a polysilicon pattern having a planar surface and high dnesity can be formed, and it is sure to produce a masking effect for ion implantation and allows high temperature heat treatment during and after the lift-off step. Accordingly, the foregoing embodiments are very useful for the fabrication of high-density and high-speed LSIs when employed in the step of forming the polysilicon film for the gate of the LSIs.

Figure 9A:
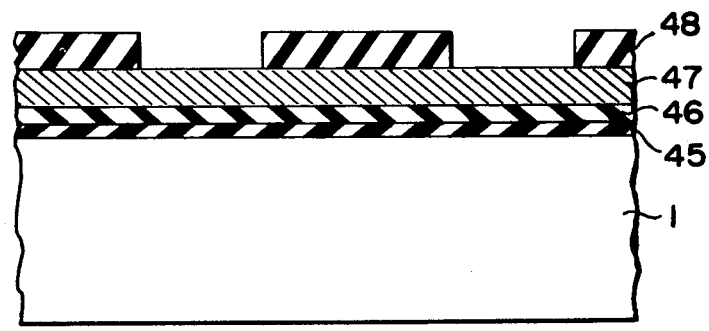
FIGS. 9A to 9G are cross sectional views illustrating a fourth embodiment of the present invention for surface planarization.
Figure 9B:
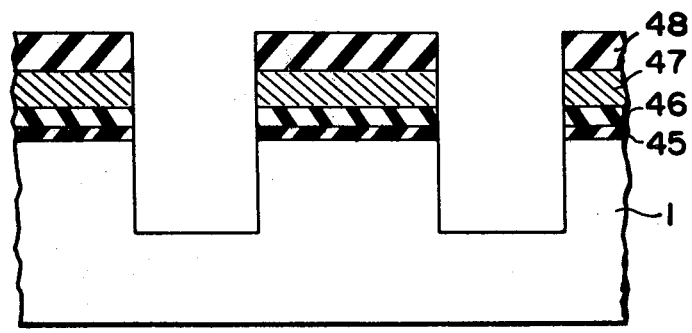
Figure 9C:
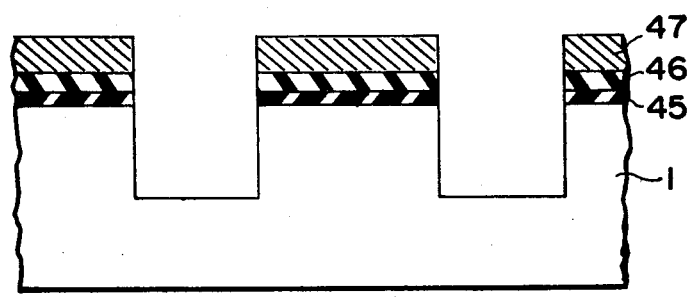
Figure 9D:
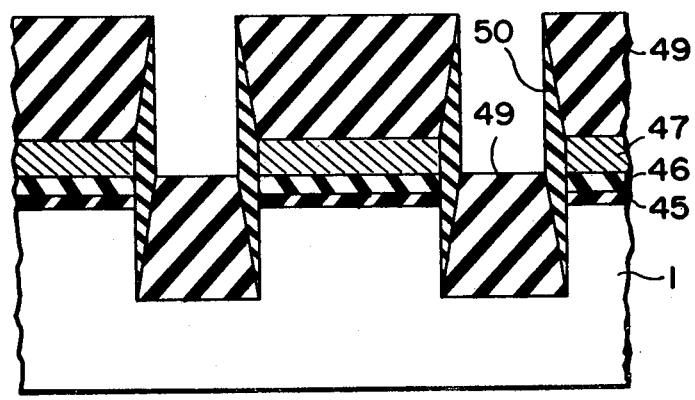
Figure 9E:
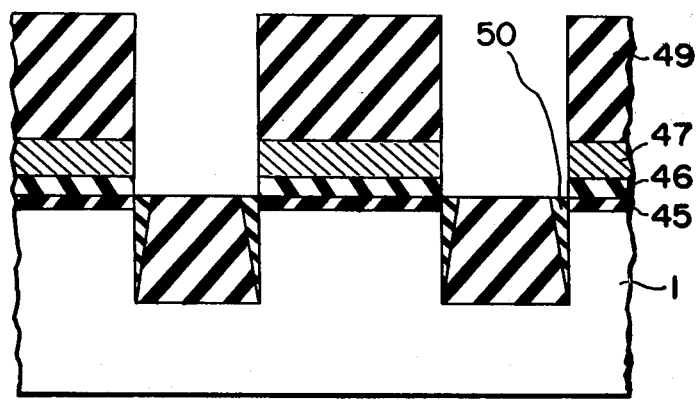
Figure 9F:
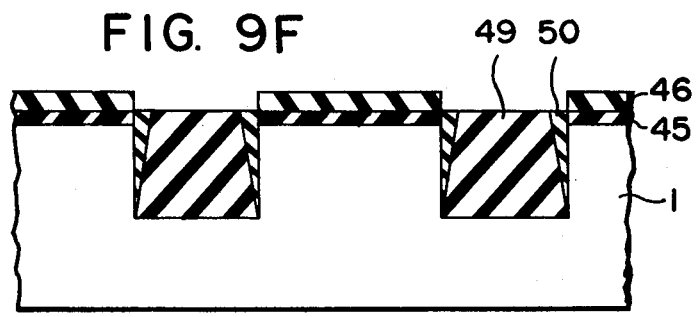
Figure 9G:
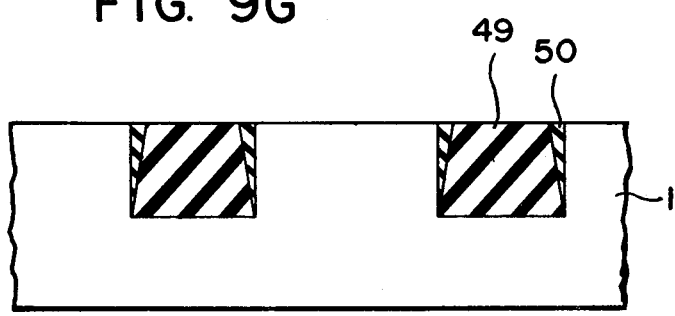

Further, since the present invention employs the lift-off technique suitable for high temperature heat treatment, it is very effective for the manufacture of such a semiconductor device as described below. FIGS. 9A to 9G illustrate a fourth embodiment of the present invention. In FIG. 9A, reference numeral 1 indicates a silicon substrate; 45 designates a thermal oxide film as a first material layer (500 Å thick); 46 identifies an $Si_3N_4$ film formed as a second material layer by the CVD method (1000 Å thick); 47 denotes a molybdenum film as a refractory metal film (3000 Å thick); and 48 represents a resist pattern. The molybdenum film 47, the $Si_3N_4$ film 46, the thermal oxide film 45 and the silicon substrate 1 are selectively etched away to dig a groove of predetermined depth, using the resist pattern as a mask, as shown in FIG. 9B. Then the resist pattern 48 is removed as depicted in FIG. 9C. After this, an $SiO_2$ film is deposited by ion beam sputtering, ECR plasma deposition or like method on the top surface of the substrate assembly to a thickness a litter larger than the etching depth of the substrate 1 as illustrated in FIG. 9D. As a result of this, the $SiO_2$ film is deposited on the top surface of the molybdenum film 47 as indicated by 49 and on the side walls of the molybdenum film 47, the $Si_3N_4$ film 46 and the oxide film 45 as indicated by 50 in FIG. 9D. As is the case with the aforementioned second embodiment, the substrate assembly is heat treated at high temperature to render the etching rate of the $SiO_2$ film 50 to substantially equal to that of the $SiO_2$ film 49, after which the substrate assembly is subjected to isotropic etching to obtain such a structure as shown in FIG. 9E. Following this, the molybdenum film 47 is lifted off by dissolving it using an $H_2SO_4/H_2O_2$ mixture solution as depicted in FIG. 9F. The oxide films 49 and 50 thus recessed in the substrate have neither V-shaped grooves nor burrs. Thereafter, the substrate assembly with the $Si_3N_4$ film remaining thereon is subjected to heat treatment or thermal oxidation. This heat treatment or thermal oxidation enhances adhesion between the silicon substrate 1 and the $SiO_2$ films 49 and 50 and improves insulating characteristics and interface characteristics between them. For instance, in the case of heat treatment, the substrate assembly is treated in an $N_2$ atmosphere at 1000° C. for 10 minutes; and in the case of thermal oxidation, the substrate assembly is subjected to wet oxidation at 1000° C. for 10 minutes. From the viewpoint of enhancement of adhesion, the thermal oxidation is rather preferable. Thereafter, the $Si_3N_4$ film 46 and the thermal oxide film 45 are etched away to obtain a buried oxide film structure having a flat surface as shown in FIG. 9G. The abovesaid heat treatment or thermal oxidation is effective also in the afore-described second or third embodiment.

It is a matter of course that in this embodiment such refractory metals as tungsten, titanium, tantalum, zirconium, niobium and so forth can be used in place of molybdenum. In FIG. 9B or 9C, even if ion implantation for forming a channel stopper is carried out for preventing field inversion, the abovesaid refractory metal as well as the oxide film 45, the $Si_3N_4$ film 46 and the resist film 48 heighten the masking effect for the ion implantation. Moreover, even if the refractory metal partly remains unremoved after the lift-off step, it does not cause contamination, so that high temperature heat treatment such as thermal oxidation and impurity diffusion can be performed in the subsequent manufacturing process. Accordingly, the abovementioned buried oxide film can be used as a high-density field isolation structure of an LSI. Furthermore, as described in the foregoing, according to the present invention, a high-density surface-flat field isolation structure or polysilicon gate structure can be obtained by the lift-off technique; accordingly, by forming such structures in a sequential order, a high-density high-speed LSIs can be fabricated with high yield rate.

As has been described in the foregoing, the lift-off process according to the present invention is advantageous in that a miniature pattern and a miniature and planar structure can be formed, which is sure to produce a masking effect for ion implantation, and that high temperature heat treatment for oxidation and impurity diffusion can be carried out after the lift-off step. In addition, there is no possibility of contamination which results from the lift-off process. Accordingly, by applying the lift-off process according to the present invention to the steps associated with the high temperature treatment in the LSI manufacturing process, for instance, a field isolation step, the polysilicon gate forming step and so forth, the yield rate of fabrication of high-density high-speed LSIs can be improved.

It will be apparent that many modifications and variations may be effected without departing from the scope of the present invention.

What is claimed is:

1. A method for the manufacture of a semiconductor device, comprising the steps of:
   (a) forming on a semiconductor substrate a first insulating material layer, a polysilicon film, and a refractory metal layer in that order;
   (b) selectively removing at least a portion of the refractory metal layer to form a predetermined pattern having a side wall and selectively removing at least a portion of the polysilicon film by using the pattern as a mask to expose an area of the first insulating material layer;
   (c) forming a second insulating material layer by an ECR plasma deposition method, which is slightly thicker than the polysilicon film, on the refractory metal pattern and the exposed area of the first insulating material layer which is not covered with the refractory metal pattern;
   (d) heat treating the semiconductor substrate including the second insulating material layer and etching away the second insulating material layer to a thickness substantially equal to that of the polysilicon film to thereby expose the side wall of the refractory metal pattern; and
   (e) dissolving the refractory metal pattern to lift it off along with the second insulating material layer overlying the refractory material pattern, thereby to obtain a structure in which the polysilicon is embedded substantially level with the second insulating material layer formed on the area of the first insulating material layer which is not covered with the refractory metal pattern.

2. A manufacturing method according to claim 1 wherein the heat treatment is carried out in a wet $O_2$ atmosphere.

3. A manufacturing method according to claim 1 wherein the refractory metal layer is formed of a material selected from the group consisting of molybdemun, tungsten, tantalum, titanium, zirconium and niobium, or their oxides or nitrides.

4. A manufacturing method according to claim 1, wherein step (a) consists essentially of forming the refractory metal layer through a reaction suppressing material layer of one of $SiO_2$ and $Si_3N_4$ after the formation of the polysilicon film; and wherein step (b) consists essentially of selectively removing the refractory metal layer, the reaction suppressing material layer and the polysilicon film to form the predetermined pattern.

5. A method for the manufacture of a semiconductor or device, comprising the steps of:
   (a) forming on a semiconductor substrate an $SiO_2$ layer, an $Si_3N_4$ layer and a refractory metal layer in that order;
   (b) selectively removing at least a portion of the refractory metal layer to form a predetermined pattern having a side wall and selectively removing the $Si_3N_4$ layer and the $SiO_2$ layer in succession by using the pattern of the refractory metal layer as a mask and, further, digging a predetermined groove in the substrate;
   (c) forming an insulating material layer by an ECR plasma deposition method on the refractory metal layer and in the groove to a thickness slightly larger than the depth of the groove;
   (d) heat-treating the substrate including the insulating material layer and etching away the insulating material layer to a height equal to that of the $SiO_2$ layer to thereby expose the side wall of the refractory metal layer;
   (e) dissolving the refractory metal layer to lift it off along with the insulating material layer overlying on the refractory metal pattern; and
   (f) subjecting the substrate including the insulating material layer to one of the heat treatment and thermal oxidation, and removing the remaining $Si_3N_4$ and $SiO_2$ patterns, thereby to obtain a structure in which the groove is filled with the insulating material to make the surface of the filled insulating material layer and the substrate substantially flat.

6. A manufacturing method according to claim 5, wherein the heat treatment is carried out in a wet $O_2$ atmosphere.

7. A manufacturing method according to claim 5, wherein the refractory metal layer is formed of a material selected from the group consisting of molybdenum, tungsten, tantalum, titanium, zirconium and niobium, or their oxides or nitrides.

* * * * *